United States Patent [19]

Nakamura et al.

[11] Patent Number: 4,644,446
[45] Date of Patent: Feb. 17, 1987

[54] ELECTROLYTIC CAPACITOR

[75] Inventors: Junji Nakamura, Joyo; Norikazu Iida, Uji; Nobukuni Ogino, Kyoto, all of Japan

[73] Assignee: Matsushita Electric Industrial Co., Ltd., Kadoma, Japan

[21] Appl. No.: 734,273

[22] PCT Filed: Sep. 11, 1984

[86] PCT No.: PCT/JP84/00441
§ 371 Date: May 9, 1985
§ 102(e) Date: May 9, 1985

[87] PCT Pub. No.: WO85/01388
PCT Pub. Date: Mar. 28, 1985

[30] Foreign Application Priority Data

Sep. 12, 1983 [JP] Japan .................. 58-167740

[51] Int. Cl.⁴ .......................... H01G 9/00; H01G 1/14
[52] U.S. Cl. ..................... 361/433; 361/306; 174/50.52
[58] Field of Search .............. 361/433, 306; 174/50.52, 50.54, 50.6, 52 R; 339/17 C, 278 R

[56] References Cited

U.S. PATENT DOCUMENTS 3,644,796  2/1972  Carino ............................ 361/433

FOREIGN PATENT DOCUMENTS 2471681   6/1981  France ............................ 339/17 C
49-127738 11/1974 Japan .
50-153457 12/1975 Japan .
55-74033   5/1980 Japan .
57-102130  6/1982 Japan .

Primary Examiner—L. T. Hix
Assistant Examiner—Douglas S. Lee
Attorney, Agent, or Firm—Cushman, Darby & Cushman

[57] ABSTRACT

This invention relates to an electrolytic capacitor in which terminal is inserted in and fixed to holes of printed circuit substrate, and by providing a pin to an anode terminal or a cathode terminal which is mounted on a terminal plate in an integral forming, right insertion and fixing on the printed circuit substrate can be made.

5 Claims, 8 Drawing Figures

ELECTROLYTIC CAPACITOR

DESCRIPTION

TECHNICAL FIELD

This invention relates to an electrolytic capacitor wherein capacitor element is encapsulated in a metal case and is to be inserted and fixed on a printed circuit substrate.

BACKGROUND ART

This kind of conventional electrolytic capacitor has been constituted as shown in FIG. 1. That is, capacitor element 1 made by winding an anode foil and a cathode foil together with a separator and soaking with an electrolyte for operation is enclosed in a metal case which is of a cylindrical shape having a bottom, open end of which is sealed with a terminal plate 3; and mounting on a printed circuit substrate is made with terminals 4 by electrically and mechanically connecting and fixing them.

Furthermore, recently a snap-in type terminal configuration has been proposed as shown in FIG. 2. This kind of electrolytic capacitor has terminals 5 of curved shape and furthermore, end tip of them are narrow, thereby making insertion on the printed circuit substrate easy.

The electrolytic capacitor has polarity as is well known, and in case it is mounted with wrong polarity not only function as the electrolytic capacitor is not achieved but also there is a danger of fire, and the opposite insertion must be practically nil. Therefore, hitherto indicating part 6 is provided on an outside sleeve or indication has been made on rivets 7 for fixing terminal.

In such case, polarity confirming of the electrolytic capacitor must be made by eye, and in actual mounting operation sometimes mounting errors (opposite insertion) occur thereby inducing unexpected accidents.

Furthermore, since such kind of electrolytic capacitor is larger in size and more heavy in weight in comparison with other electronic components, when it is mounted on a printed circuit substrate and the apparatus is vibrated, effect on the printed circuit substrate centers around terminal parts of the electrolytic capacitor and peeling off of copper foil of the printed circuit substrate or the like has happened.

Furthermore, in actual mounting operation, such kind of aluminum electrolytic capacitor together with other electronic components are soldered, and thereafter to flux washing-out is carried out to remove pine resin. In such case, washing agent is retained in a gap between the printed circuit substrate and the electrolytic capacitor; and since the washing agent is constituted with organic chrolide compound, it has become a cause to make corrosion defect of the aluminum electrolytic capacitor.

DISCLOSURE OF INVENTION

Accordingly, this invention intends to provide an electrolytic capacitor which is free from occurrence of mounting error or corrosion defect, by providing a pin which is formed integral with an anode terminal or a cathode terminal in an electrolytic capacitor wherein a capacitor element is enclosed in a case.

BEST MODE FOR CARRYING OUT THE INVENTION

Figure 1:
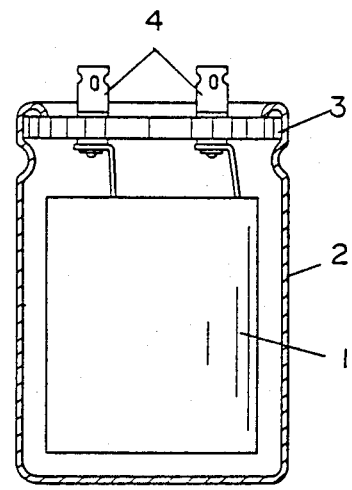
FIG. 1 is the sectional view of the general electrolytic capacitor.
Figure 2:
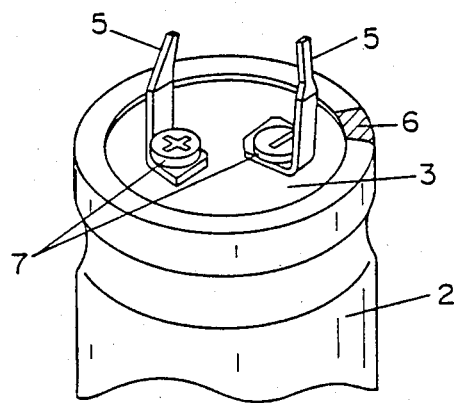
FIG. 2 is a perspective view showing terminal part of the conventional electrolytic capacitor.
Figure 3:
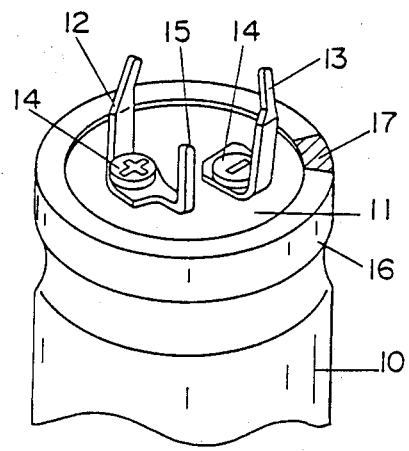
FIG. 3 and FIG. 4 are a perspective view and a plan view showing terminal part of an electrolytic capacitor in accordance with one embodiment of the present invention, respectively.
Figure 4:
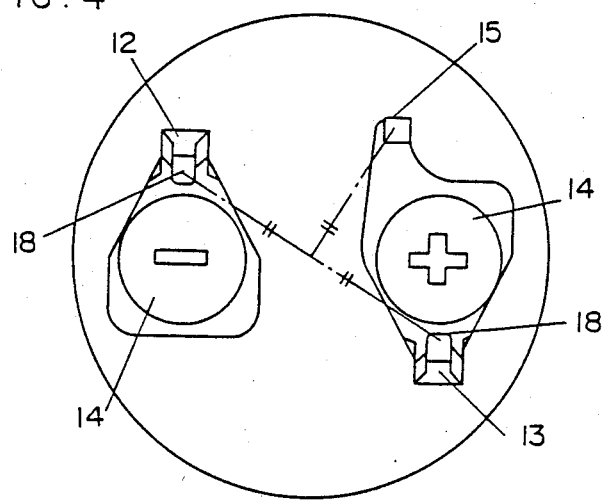

FIG. 3 and FIG. 4 show one embodiment of an electrolytic capacitor in accordance with the present invention, and in FIG. 3 numeral 10 is a metal case in which capacitor element is enclosed, and open end of this metal case is sealed by a terminal plate 11. On this terminal plate 11, an anode terminal 12 and a cathode terminal 13 are fixed by rivets 14, and furthermore the anode terminal 12 is provided with a pin 15 in an integral forming. Furthermore, on the outer peripheral part of the metal case 10 an outside sleeve 16 is provided to cover, and an indication part 17 for indicating a polarity is provided on the outside sleeve 16. With respect to dispositions of the anode terminal 12, the cathode terminal 13 and the pin 15, the disposition is configurated, as shown in FIG. 4, such that the pin 15 is disposed on a vertical straight line to a straight line connecting the end tip parts 18 of the anode terminal 12 and the cathode terminal 13 and passing the center point of the stright line, so that these three points form a right angled isosceles triangle. Shape of the anode terminal 12 and the cathode terminal 13 as such are configurated in a manner that their base parts are thicker than their end tip parts.

Figure 5:
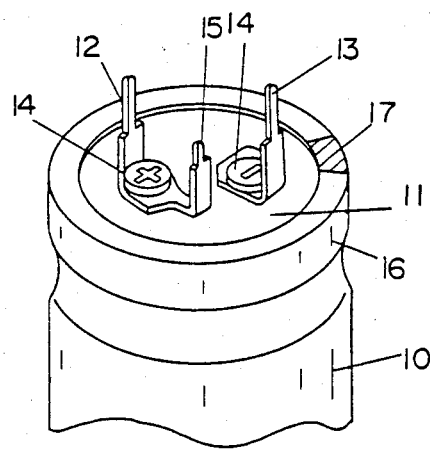
FIG. 5 and FIG. 6 are a perspective view and a plan view showing terminal part of an electrolytic capacitor in accordance with another embodiment of the present invention, respectively.
Figure 6:
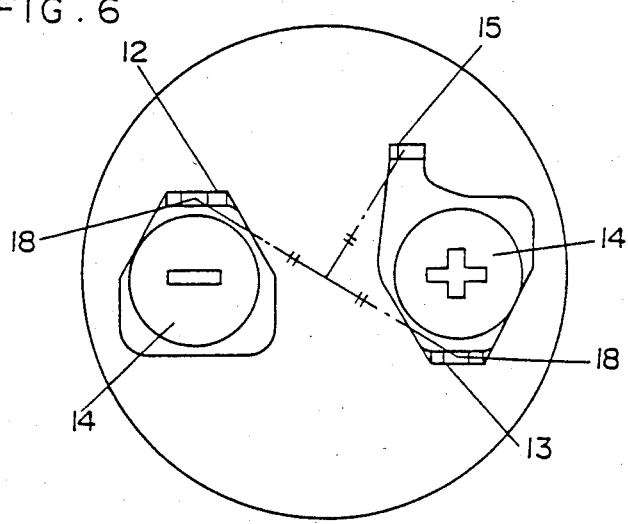
Figure 7:
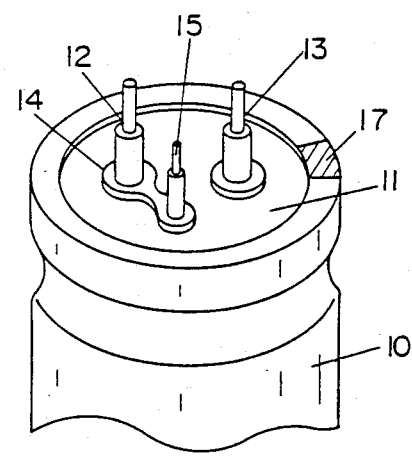
FIG. 7 is a perspective view showing a terminal part of an electrolytic capacitor of one example of another embodiment in accordance with the present invention.

FIG. 5–FIG. 7 show other embodiment of this invention. In the embodiment shown in FIG. 5 and FIG. 6, in place of a bent anode terminal 12 and a bent cathode terminal 13 in the embodiment of FIG. 3 and FIG. 4, a straight anode terminal 12 and a straight cathode terminal 13 are used.

Furthermore, in the embodiment shown in FIG. 7, a circular-shaped anode terminal 12 and a circular shaped cathode terminal 13 are used. Also, in these embodiments, base parts of the anode terminal 12 and the cathode terminal 13 are made thicker than the end tip parts, and dispositions of the anode terminal 12, the cathode terminal 13 and the pin 15 are arranged in similar positional relation to the embodiment of FIG. 3 and FIG. 4.

By this constitution, in case the electrolytic capacitor is mounted on a print circuit substrate, since three ones, the anode, the cathode and further the pin, are inserted into holes of the printed circuit substrate, there is no possibility of opposite insertion at all. That is, if constitution is made only with the anode terminal 12 and the cathode terminal 13, the mounting on the printed circuit substrate is only a case of being rightly inserted or a case of being oppositely inserted turning 180° the electrolytic capacitor as such 180°. According to the constitution of the present invention, since the pin 15 is disposed at a position which is other than a position on a line connecting the anode terminal 12 and the cathode terminal 13, for instance, in the case of opposite position the pin 15 is not inserted by colliding the printed circuit substrate; and being oppositely inserted is completely prevented.

Furthermore, since the disposition is that the end tip of the anode terminal 12 and the end tip of the cathode terminal 13 and the end tip of the pin 15 form a right angled isosceles triangle, it is extraordinarily strong against vibration of an apparatus after the mounting.

Furthermore, according to the constitution of the present invention, since the pin 15 is connected to the anode terminal 12 or the cathode terminal 13, copper foil of the printed circuit substrate to be connected to them needs to be configurated broad, and accordingly peeling off of the copper foil against vibration of the apparatus decreases.

Figure 8:
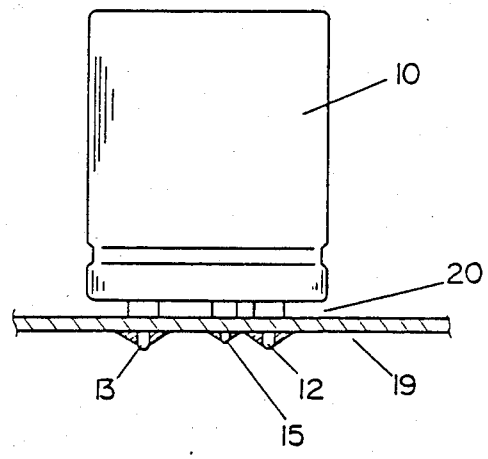
FIG. 8 is a sectional view showing a state wherein an electrolytic capacitor in accordance with the present invention is actually mounted on a printed circuit substrate.

Furthermore, according to the constitution of the present invention, since at least one of the anode terminal 12, cathode terminal 13 and pin 15 is made such that the thickness of the base part is thicker than the end tip part, when mounted on the printed circuit substrate a gap 20 can be provided between the electrolytic capacitor body and the printed circuit substrate 19 as shown in FIG. 8, after carrying out flux-washing the washing agent can be very easily evaporated, and corrosion defect of the electrolytic capacitor by the washing agent does not occur.

INDUSTRIAL APPLICABILITY

As has been elucidated, according to the electrolytic capacitor of the present invention, since the pin is formed integrally to the anode terminal or the cathode terminal, when assembling on the printed circuit substrate, there is no assemblage with wrong porality; and by arranging the anode terminal, the cathode terminal and the pin in specified positions, especially such that, lines connecting the end tips of the respective terminals and the pin form the right angled issosceles triangle, it can be assembled on the printed circuit substrate in a stabilized state; and it can be made a strong one which after mounting has no peeling off of cupper foil of the printed circuit substrate against vibration after mounting, and it can be made splended one as electrolytic capacitor for printed circuit substrate mounting.

Furthermore, by making base part of at least one of the anode terminal, the cathode terminal and the pin be thicker than the end tip part, a gap can be provided between the electrolytic capacitor and the printed circuit substrate, and corrosion of the electrolytic capacitor by washing agent can be prevented.

We claim:

1. An electrolytic capacitor wherein a capacitor element is enclosed in a case, an open end of said case is sealed by a terminal plate, and said terminal plate has thereon an anode terminal pin and a cathode terminal pin, characterized in that a third pin is provided on one of said anode terminal pin and said cathode terminal pin integral therewith, and said anode terminal pin, said cathode terminal pin and said third pin are disposed in a manner so that an end tip of said third pin is positioned substantially on a straight line which intersects the center of and is perpendicular to a straight line connecting an end tip of said anode terminal pin and an end tip of said cathode terminal pin.

2. An electrolytic capacitor in accordance with claim 1, wherein at least one of said anode terminal pin, said cathode terminal pin and said third pin has a shape so that a base part thereof is larger than an end tip part thereof.

3. An electrolytic capacitor wherein a capacitor element is enclosed in a case, an open end of said case is sealed by a terminal plate, and said terminal plate has therein an anode terminal pin and a cathode terminal pin, characterized in that one of said anode terminal pin and said cathode terminal pin is provided with a third pin, and said anode terminal pin, said cathode terminal pin and said third pin are disposed in a manner so that an end tip of said third pin is positioned substantially on a straight line which intersects a center of and is perpendicular to a straight line connecting an end tip of said anode terminal pin and an end tip of said cathode terminal pin.

4. An electrolytic capacitor according to claim 3 wherein said third pin has a shape so that a base part thereof is larger than an end tip part thereof.

5. An electrolytic capacitor in accordance with claim 3, wherein said anode terminal pin, said cathode terminal pin and said third pin are disposed in a manner so that straight lines connecting the end tips of said pins form a right angle isosceles triangle.

* * * * *